(12) United States Patent
Thuruthiyil et al.

(10) Patent No.: US 6,756,255 B1
(45) Date of Patent: Jun. 29, 2004

(54) CMOS PROCESS WITH AN INTEGRATED, HIGH PERFORMANCE, SILICIDE AGGLOMERATION FUSE

(75) Inventors: Ciby Thuruthiyil, Fremont, CA (US); Philip A. Fisher, Foster City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 18 days.

(21) Appl. No.: 10/014,064

(22) Filed: Dec. 10, 2001

(51) Int. Cl.[7] ............................................. H01L 21/82
(52) U.S. Cl. ...................... 438/132; 438/215; 438/601; 438/281
(58) Field of Search .............................. 438/132, 215, 438/233, 601, 664, FOR 453, FOR 217, FOR 433, 281

(56) References Cited

U.S. PATENT DOCUMENTS

| | | | |
|---|---|---|---|
| 4,647,340 A | * 3/1987 | Szluk et al. | 438/281 |
| 5,708,291 A | * 1/1998 | Bohr et al. | 257/529 |
| 5,821,160 A | * 10/1998 | Rodriguez et al. | 438/601 |
| 5,882,998 A | * 3/1999 | Sur et al. | 257/209 |
| 6,022,775 A | 2/2000 | Tsai et al. | |
| 6,242,790 B1 | 6/2001 | Tsui et al. | |
| 6,391,767 B1 | * 5/2002 | Huster et al. | 438/630 |
| 2002/0074618 A1 | * 6/2002 | Marshall et al. | 257/529 |

OTHER PUBLICATIONS

Wolf S. "Silicon Processing for the VLSI–ERA: vol. 1–Process Technology", 1986, Lattice Pr., vol. 1, p. 441.*

Alexander Kalnitsky, Irfan Saadat, Albert Bergemont and Pascale Francis, "$CoSi_2$ Integrated fuses on poly silicon for low voltage 0.18 μm CMOS applications", National Semiconductor, Santa Clara, CA 95052, 0–7803–5413–399, 4 pp. (1999).

Mohsen Alavi, Mark Bohr, Jeff Hicks, Martin Denham, Allen Cassens, Dave Douglas, Min–Chun Tsai, "A PROM Element Based on Salicide Agglomeration of Poly Fuses in a CMOS Logic Process", IEEE International Electron Devices Meeting (Dec. '97) 4 pp.

Jerome B. Lasky, James S. Nakos, Orison J. Cain, and Peter J. Geiss, "Comparison of Transformation to Low–Resistivity Phase and Agglomeration of $TiSi_2$ and $CoSi_2$", IEEE Transactions on Electron Devices, vol. 38, No. 2, Feb. 1991, pp. 262–269.

* cited by examiner

Primary Examiner—George Fourson
(74) Attorney, Agent, or Firm—Farjami & Farjami LLP

(57) ABSTRACT

A complementary metal oxide semiconductor (CMOS) fabrication process. The process comprises creating a polysilicon layer having a first thickness for a transistor gate area and a second thickness for a fuse area. The first thickness is greater than the second thickness, wherein most of the polysilicon in the fuse area will react with a metal layer to form polysilicide during a rapid thermal anneal (RTA) process.

26 Claims, 12 Drawing Sheets

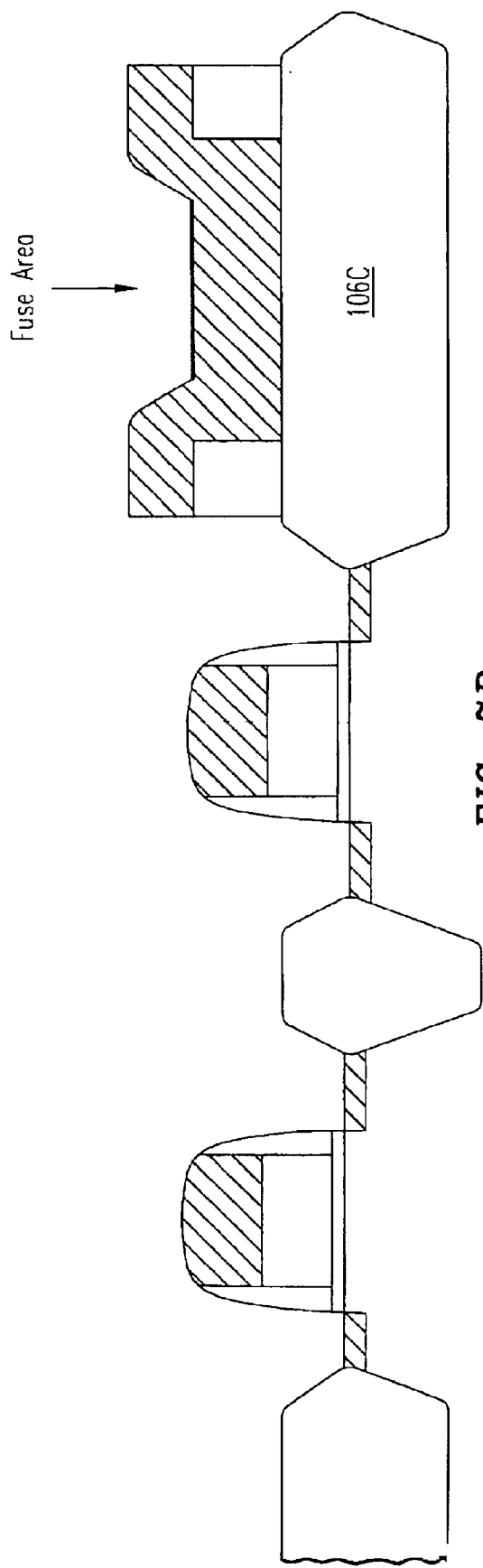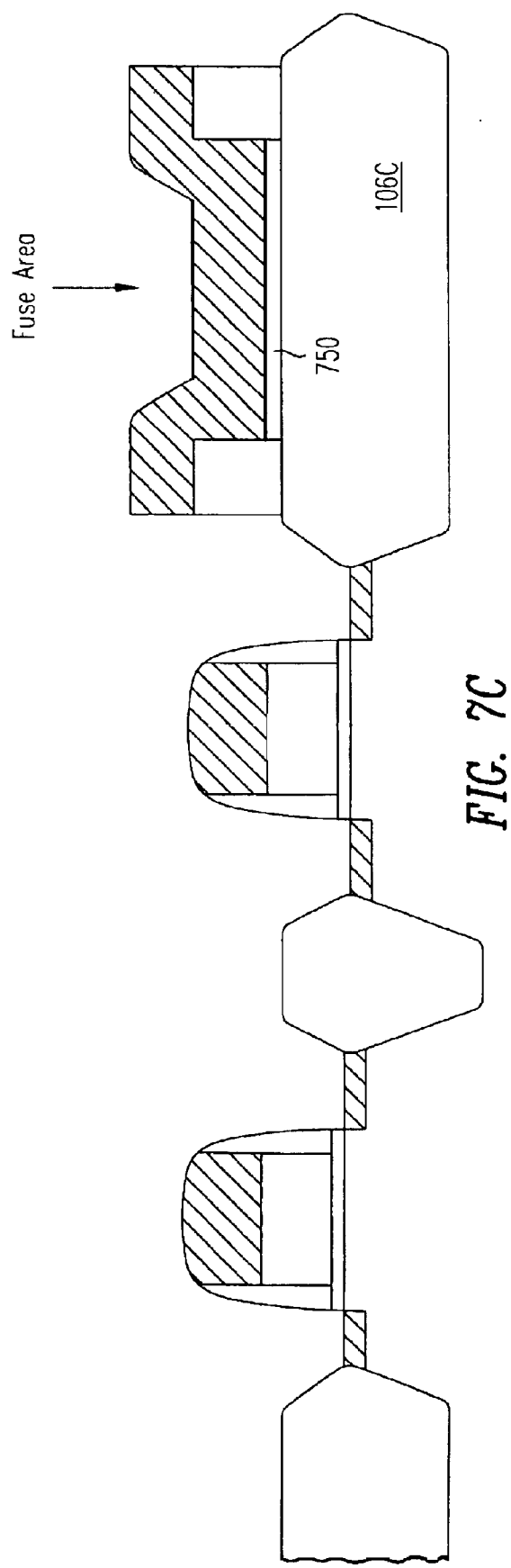

CMOS PROCESS WITH AN INTEGRATED, HIGH PERFORMANCE, SILICIDE AGGLOMERATION FUSE

FIELD OF THE INVENTION

The present invention relates to integrated circuits and in particular to complementary metal oxide semiconductor (CMOS) integrated circuit processes and devices.

BACKGROUND OF THE INVENTION

Some CMOS integrated circuit processes have attempted to form transistor elements and one-time programmable elements, called "poly fuses," out of silicided polysilicon (also called polysilicide) on a polysilicon layer. These processes have tried to use the phenomenon of silicide "agglomeration" to program the poly fuses. When a sufficiently high current is dissipated in or passed through an unprogrammed poly fuse, the temperature of the fuse material (silicided polysilicon) rises above a certain critical temperature, which causes the silicided polysilicon to change phase. This phase change is commonly called "agglomeration." The silicided polysilicon transitions from a low resistance phase to a high resistance phase, which is called "programming" the fuse. In some cases, the phase change is accompanied by physical movement of the silicided polysilicon away from the hottest point, which can be ascertained by a post-processing physical analysis.

SUMMARY OF THE INVENTION

One-time programmable elements, such as silicide agglomeration fuses, may be used as programmable elements in a wide range of integrated circuit applications. In some applications, Moore's law requires reduced supply voltages, which creates the desire for a high performance fuse that can be programmed at a low voltage.

A CMOS process with an integrated, high performance, silicide agglomeration fuse is provided in accordance with the present invention. The fuse structure in one embodiment of the invention provides optimum performance with low voltage programming. The CMOS process according to one embodiment of the invention may advantageously include all features or comply with all process conditions of a standard state-of-the-art 0.18 μm or 0.13 μm CMOS process or other CMOS processes. These conditions may include rapid thermal anneal (RTA) processes, temperatures and time periods for silicidation to form transistors. One embodiment of the proposed CMOS process of the invention includes an additional process to optimize the performance of a "poly fuse" programmable by polysilicide agglomeration.

One objective for a high performance, polysilicide agglomeration fuse is to have a post-programming fuse resistance ("blown fuse" resistance) much higher than a pre-programming or unprogrammed fuse resistance ("fresh fuse" resistance). The ratio of post-programming fuse resistance to pre-programming fuse resistance may be called the "figure of merit" of the fuse. The poly fuse according to the present invention may increase this figure of merit by at least a factor of 10 to over 1000, for example. If the figure of merit of a poly fuse is sufficiently large, a sense circuit connected to the poly fuse may read the fuse after programming without any ambiguity.

If a programmed fuse with a very small "figure of merit" value is read by the sense circuit as programmed, the fuse can cause circuit malfunction and reliability issues. If the sense circuit is designed to handle small values of the resistance ratio between a programmed and an unprogrammed fuse (figure of merit), the probability of circuit malfunction and unreliability is high. The improved fuse design of the present invention with a large figure of merit will greatly enhance circuit reliability and give greater flexibility for the designers to make robust sense circuit designs.

The process according to the invention forms a thinner field polysilicon layer (fuse poly) to ensure that the entire fuse poly layer is consumed during silicidation. When the thinner polysilicide is agglomerated during fuse programming, an insulator layer (e.g., TEOS or similar material) underneath the polysilicide is exposed, which forms an ideal open circuit. Thus, the post-programming resistance of this ideal polysilicide agglomeration fuse can be infinitely high.

One aspect of the invention relates to a method of forming an integrated circuit with a transistor and a polysilicide fuse. The method comprises forming a polysilicon layer on a surface of a silicon substrate, the silicon substrate having a first insulator and a second insulator formed at two areas on the surface of the silicon substrate; forming a mask layer over the polysilicon layer, the mask exposing an area of the polysilicon layer over the second insulator; and etching the exposed area of the polysilicon layer a pre-determined amount, such that an unetched portion of the polysilicon layer in the exposed area will react with a metal layer to form polysilicide during a rapid thermal anneal (RTA) process.

Another aspect of the invention relates to a complementary metal oxide semiconductor (CMOS) fabrication process. The process comprises creating a polysilicon layer having a first thickness for a transistor gate area and a second thickness for a fuse area, the first thickness being greater than the second thickness, wherein most of the polysilicon in the fuse area will react with a metal layer to form polysilicide during a rapid thermal anneal (RTA) process.

Another aspect of the invention relates to an integrated circuit. The circuit comprises a silicon substrate; a first insulator and a second insulator formed at two areas on a surface of the silicon substrate; a transistor formed on the silicon substrate between the first and second insulators; and a polysilicide fuse formed over the second insulator, the polysilicide fuse having an active area where polysilicide directly contacts the insulator, wherein the transistor and the polysilicide fuse are formed with a common silicidation process.

BRIEF DESCRIPTION OF THE DRAWINGS

FIG. 7B illustrates the structure of FIG. 1 at another stage of processing, which may be after processing in FIG. 5 or FIGS. 6 and 7A.

FIG. 7C illustrates the structure of FIG. 1 at another stage of processing, which may be after processing in FIG. 5 or FIGS. 6 and 7A.

DETAILED DESCRIPTION

Figure 1:
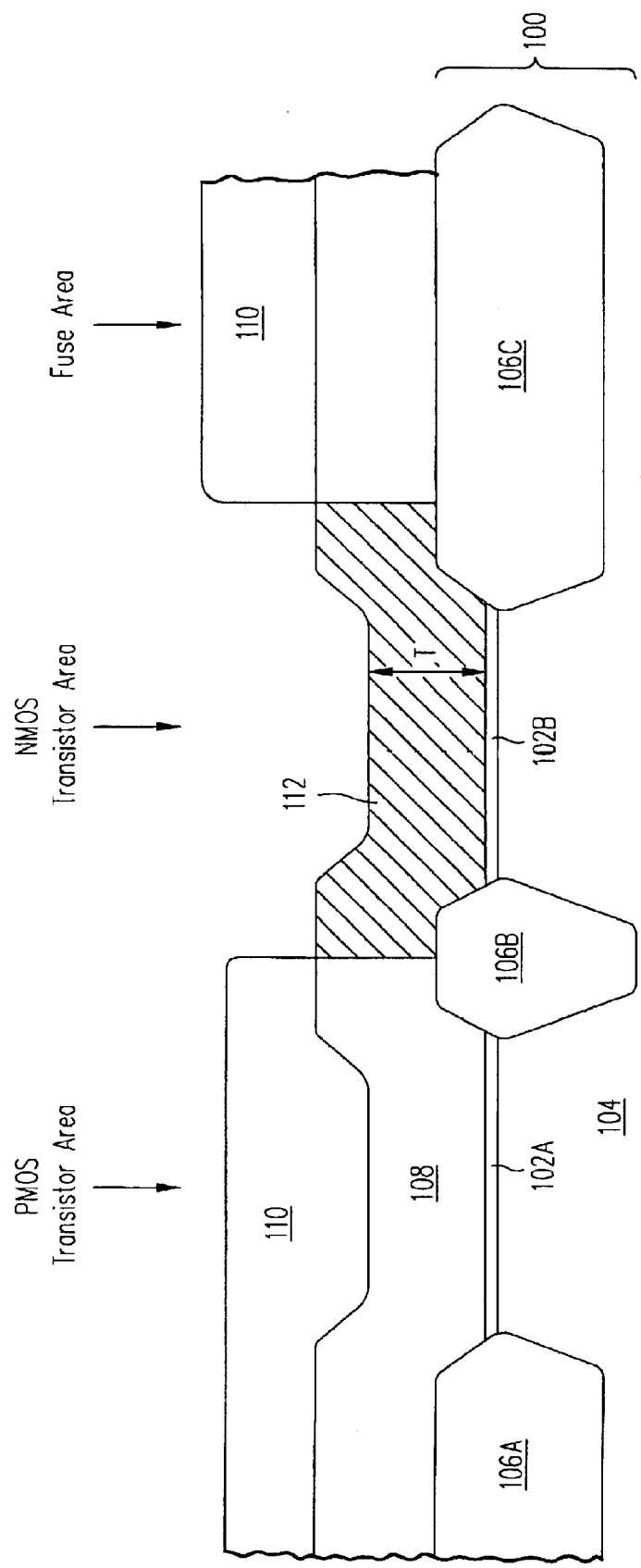
FIG. 1 illustrates one embodiment of a structure comprising a silicon wafer with formed insulation layers or elements.

FIG. 1 illustrates one embodiment of a structure 100 comprising a silicon wafer 104 with formed insulation layers or elements 106A–106C. The insulators 106A–106C may be formed of any suitable insulation material, such as TEOS, and may be fabricated by either local oxidation of silicon (LOCOS) or shallow trench isolation (STI) according to the design rules of the technology. The structure 100 in FIG. 1 may be used to form a CMOS integrated circuit with transistors and fuses. The present invention may be applied to any configuration and any number of transistors and fuses. Two transistors and a fuse are described below with reference to the Figures merely as an example. In addition, the sizes and thicknesses of the elements and layers shown in the Figures are not drawn to scale and are not intended to be limitations.

Any state-of-the-art or future CMOS process, such as 0.18 $\mu$m, 0.13 $\mu$m or 0.10 $\mu$m, may be used to form the elements described below. One or more of the acts described below may be modified or performed in a different sequence.

The surface of the silicon substrate 104 in FIG. 1 may be cleaned with a pre-gate-oxide clean process, and a gate oxide layer 102A, 102B may be formed. In one embodiment, the gate oxide layer is less than 2 nm thick. Then a polysilicon layer 108 may be deposited.

In one embodiment, the polysilicon layer 108 has a thickness T of about 100 nm to about 150 nm, such as 120 nm or 130 nm. The thickness T is typically a compromise between (1) a desire for increased margin for a gate patterning process to create a narrow gate, which is facilitated by a thinner poly, and (2) a desire for high dose implants for the transistor source-drain regions, in which a thicker poly will more effectively block source-drain implanted species, particularly Boron, from penetrating the channel. The desire to pattern smaller transistor gates in order to raise transistor drive strength is expected to force the poly thickness T to be reduced every few technology generations.

For example, for a technology (such as a 0.18 $\mu$m technology) having a 100 nm transistor gate, a poly thickness of 150 nm to 200 nm may provide adequate process latitude for the gate patterning process. As another example, for a 50-nm transistor gate, a poly thickness of 100 nm to 120 nm may be adequate to achieve a desired process margin. As another example, for a 35-nm transistor gate, a poly thickness of 100 nm may be adequate to achieve a desired process margin. In other embodiments, the thickness T of the poly may be about 50 nm or less, such as 10 nm.

To form an n-type MOS (NMOS) transistor, a mask 110 (called an NMOS implant resist) may be formed for gate pre-doping. Then a pre-doping implant may be applied to a region 112 of the polysilicon layer 108. The mask 110 may be removed for further processing.

Figure 2:
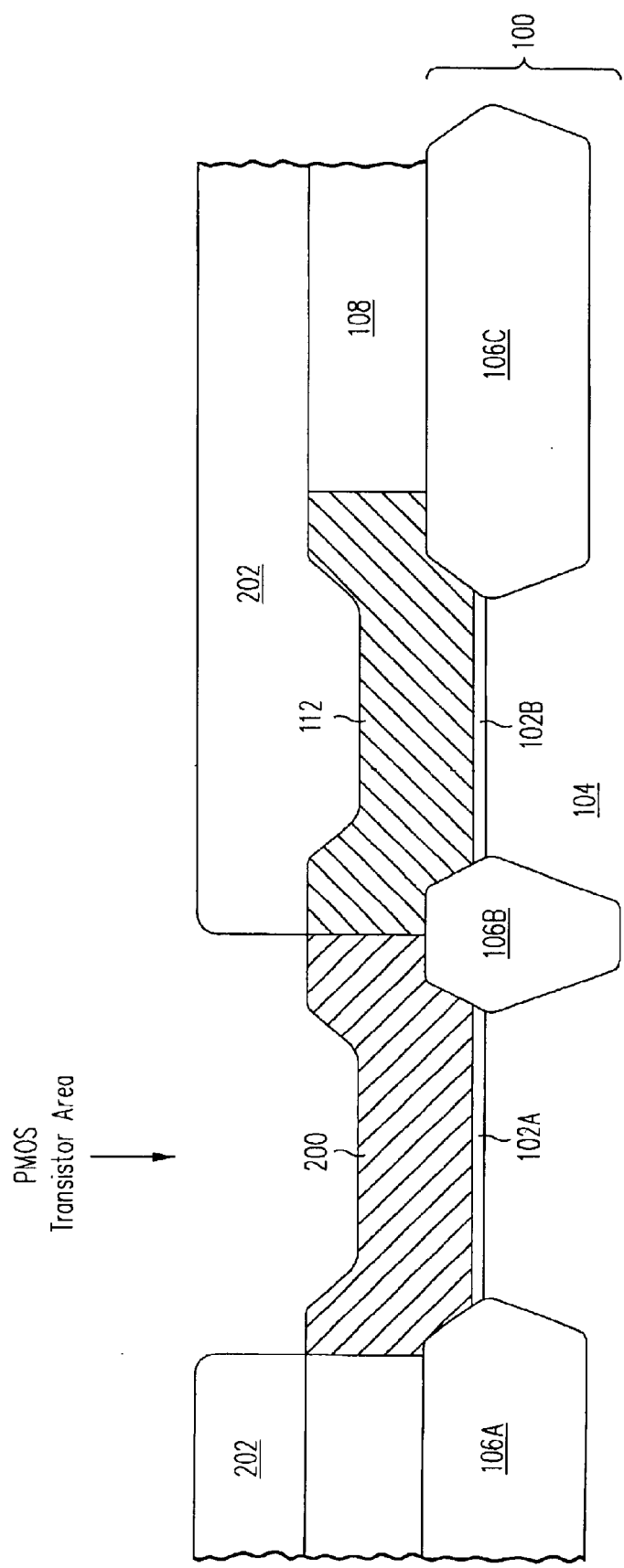
FIG. 2 illustrates the structure of FIG. 1 at another stage of processing, which may be after processing in FIG. 1.

FIG. 2 illustrates the structure 100 of FIG. 1 at another stage of processing, which may be after processing in FIG. 1. To form a p-type MOS (PMOS) transistor, a mask (called a PMOS implant resist) 202 in FIG. 2 may be formed for gate pre-doping. Then a pre-doping implant may be applied to a region 200 of the polysilicon layer 108. The mask 202 may be removed for further processing.

Figure 3:
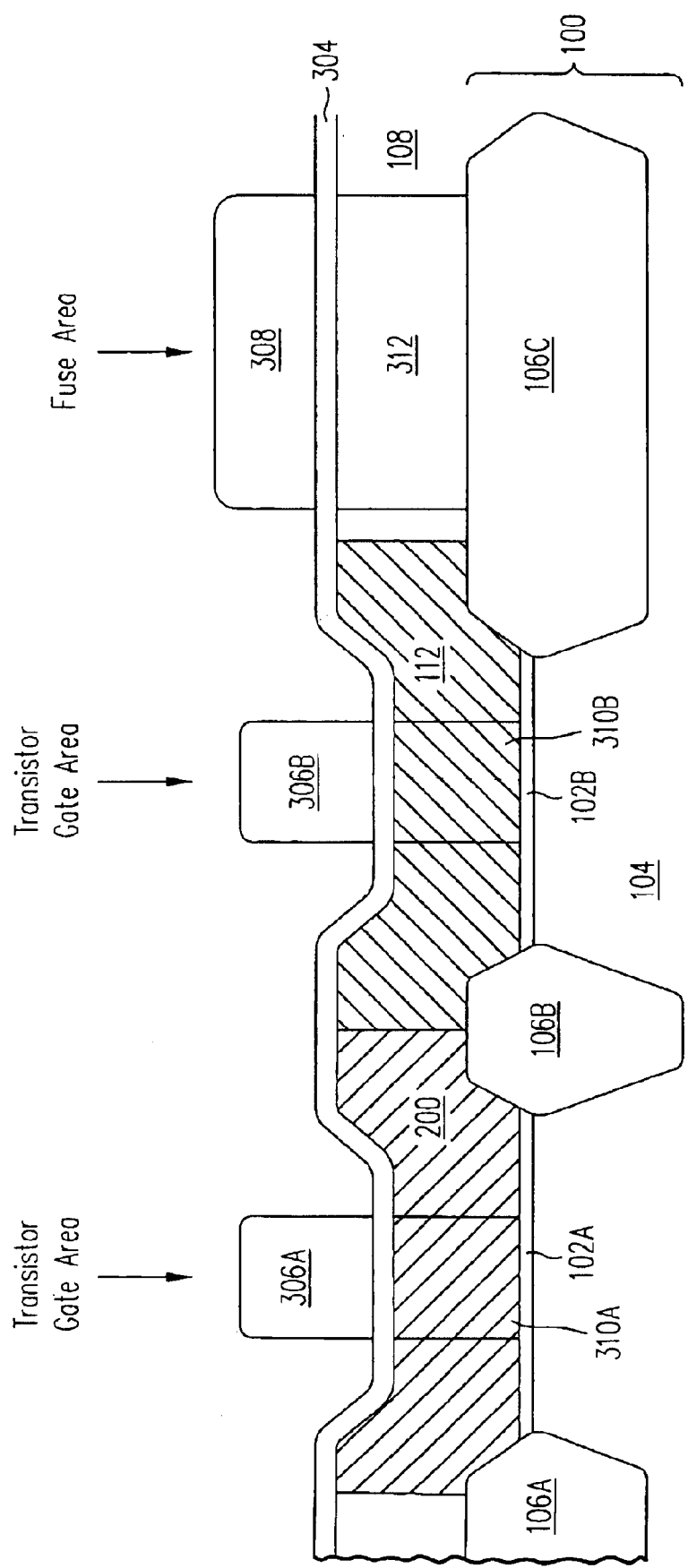
FIG. 3 illustrates the structure of FIG. 1 at another stage of processing, which may be after processing in FIG. 2.

FIG. 3 illustrates the structure 100 of FIG. 1 at another stage of processing, which may be after processing in FIG. 2. In FIG. 3, a bottom anti-reflective coating (BARC) 304 (also called a BARC film or ARC "under resist") may be formed. The surface of the polysilicon layer 108 (FIG. 2) may be fairly smooth and facilitate the deposition of a BARC film with a well-controlled thickness and optical properties by chemical vapor deposition (CVD), such as PECVD or LPCVD.

Then a photoresist layer (not shown), such as a photosensitive plastic, may be formed on both transistor gate areas and the fuse area. The photoresist may be trimmed to form photoresist structures 306A, 306B, 308 as shown in FIG. 3. Without the BARC 304, when the photoresist is exposed, reflections off an interface between the photoresist and the polysilicon layer will cause a resulting post-develop resist profile to be tapered rather than straight.

Figure 4:
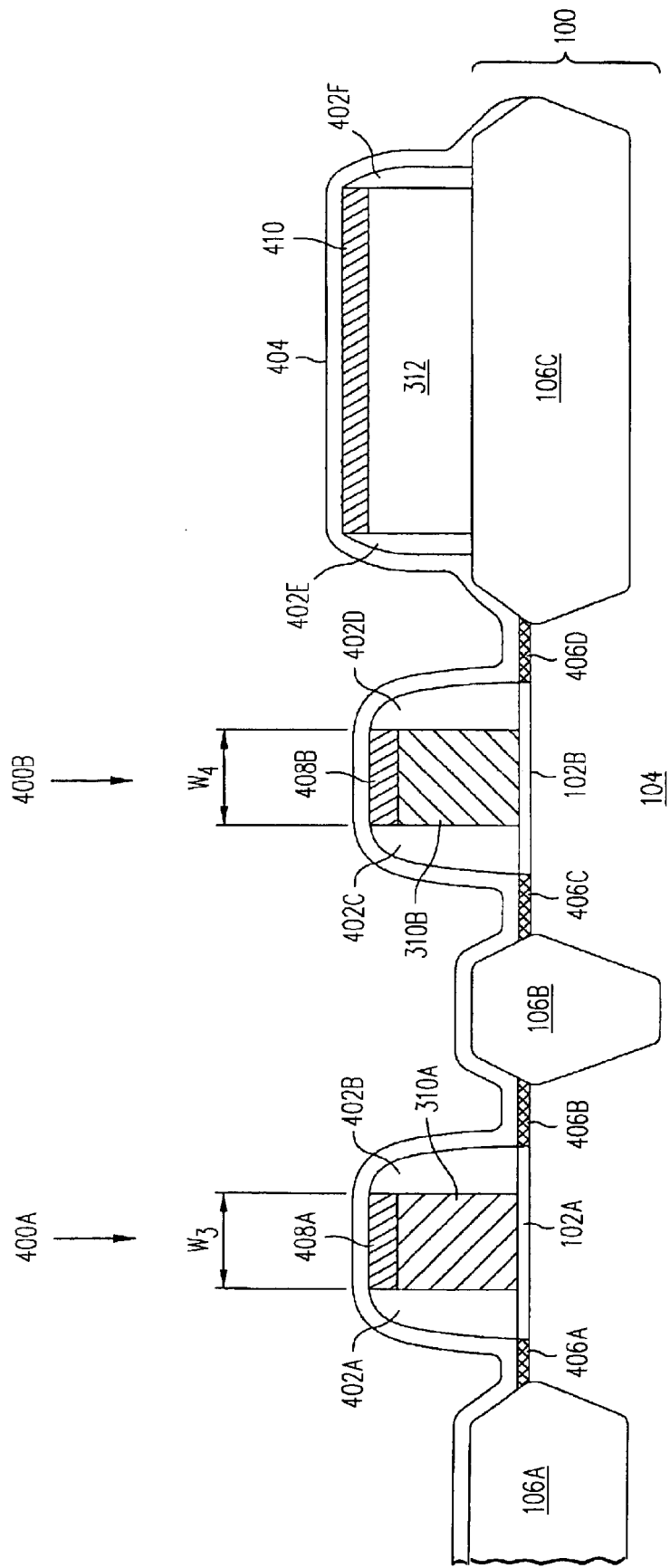
FIG. 4 illustrates the structure of FIG. 1 at another stage of processing, which may be after processing in FIG. 3.

Using the trimmed photoresist structures 306A, 306B, 308 as defined patterns, portions of the BARC layer 304 and the polysilicon layer 108 in FIG. 3 may be etched with a main etch process, a soft landing process and an over-etch process, if desired, to form polysilicon gate areas 310A, 310B and a polysilicon fuse area 312 shown in FIG. 3 and 4. In one embodiment, the polysilicon gate areas 310A, 310B in FIG. 4 may have widths W3, W4 of about 50 nm to 100 nm, such as 60 nm or 70 nm, for current technologies.

In one embodiment, the gate etch process is designed to prevent any punctures of the gate oxide layers 102A, 102B.

In one embodiment, gate etching is followed by a passivant clean process to remove etch polymer residue, a critical dimension (CD) measurement, an inspection for resist scum, a short oxidation (grows about 2 nm on active region and about 4 nm on sides of gates), and removing the BARC layer 304. Because the BARC 304 is typically some kind of silicon nitride or oxynitride, removing the BARC 304 may comprise a hot phosphoric acid clean, but plasma etches can be used as well.

In other embodiments, the BARC 304 may be removed much later in the process flow, as long as polysilicon in the gate areas 310A, 310B and silicon 104 in the active regions are exposed when a material such as cobalt is deposited.

In one embodiment, an oxidation process increases the thickness of the gate oxide layers 102A, 102B in FIG. 3.

FIG. 4 illustrates the structure 100 of FIG. 1 at another stage of processing, which may be after processing in FIG. 3. After patterning the transistor gate areas 310A, 310B, several masking processes (used to define implant areas) and implant processes may be performed to form transistors 400A, 400B shown in FIG. 4. Nitride spacers 402A–402F may be formed on the sides of the etched polysilicon gate areas 310A, 310B and the polysilicon fuse area 312. More implants may be performed.

Underneath the nitride spacers 402A–402D, the oxide layers 102A, 102B are present and may actually be thicker than directly underneath the gate areas 400A, 400B. Portions of the oxide layers 102A, 102B in FIG. 3 between the spacers 402A–402F and the insulators 106A–106C (not protected by the spacers and doped gate polysilicon areas 310A, 3101B) are eventually removed, for example, by the combined effect of multiple cleaning processes at various points in the flow. Each cleaning process may remove a few angstroms of the oxide layers 102A, 102B between the spacers 402A–402F and the insulators 106A–106C, and eventually these portions of the oxide layer are removed.

In addition, portions of the oxide layers 102A, 102B between the spacers 402A–402D and the insulators 106A–106C may be removed during nitride etching as the nitride spacers 402A–402D are formed and etched. Multiple cleaning processes between spacer definition and cobalt deposition will remove most of the remaining portions of the oxide layers 102A, 102B between the spacers 402A–402D and the insulators 106A–106C.

Portions of the oxide layers 102A, 102B between the spacers 402A–402D and the insulators 106A–106C are removed in order to expose surfaces of the silicon substrate 104 between the spacers 402A–402D and the insulators 106A–106C (unprotected by the spacers 402A–402D and polysilicon gate areas 310A, 3103B) before a material such as cobalt is deposited. This may be achieved by including an in-situ sputter clean process in the cobalt deposition recipe. In one embodiment, a cobalt deposition recipe includes a sputter clean capable of removing about 3 nm of oxide, followed by the cobalt deposition, followed by a capping layer of about 5 nm of Ti or TiN.

After cleaning, a cobalt layer 404 may be deposited on all elements, as shown in FIG. 4. In one embodiment, the cobalt layer 404 is about 150 Å thick and the polysilicon layer 312 is about 1200–1500 Å thick. Other thicknesses may be used in other embodiments. Instead of cobalt, other elements may be used, such as titanium or nickel.

One or more rapid thermal anneal (RTA) processes then turn some of the cobalt layer 404 in contact with the silicon substrate 104 and the polysilicon gate areas 310A, 310B and the polysilicon fuse area 312 into polysilicide areas 406A–406D, 408A–408B, 410 (also called silicided polysilicon). Any unreacted cobalt that did not react with the silicon 104 or polysilicon areas 310A, 310B, 312 to form CoSi may be stripped or otherwise removed.

In one embodiment, a formation RTA process with a temperature of about 430–480° C. and about one minute in duration forms CoSi. Then unreacted Co is stripped. Then a second formation RTA with a temperature of about 675–775° C. and a few seconds in duration is applied to form $CoSi_2$.

Methods of Forming an Improved Fuse

In one embodiment of the present invention, a polysilicon fuse area is thinner than the polysilicon transistor gate areas, such that substantially all of the polysilicon fuse area is converted to polysilicide during one or more RTA processes. In one embodiment, the polysilicon thickness and the polysilicide thickness are dictated by optimizing transistor performance and ease of 100-nm to 150-nm gate patterning processes.

Figure 5:
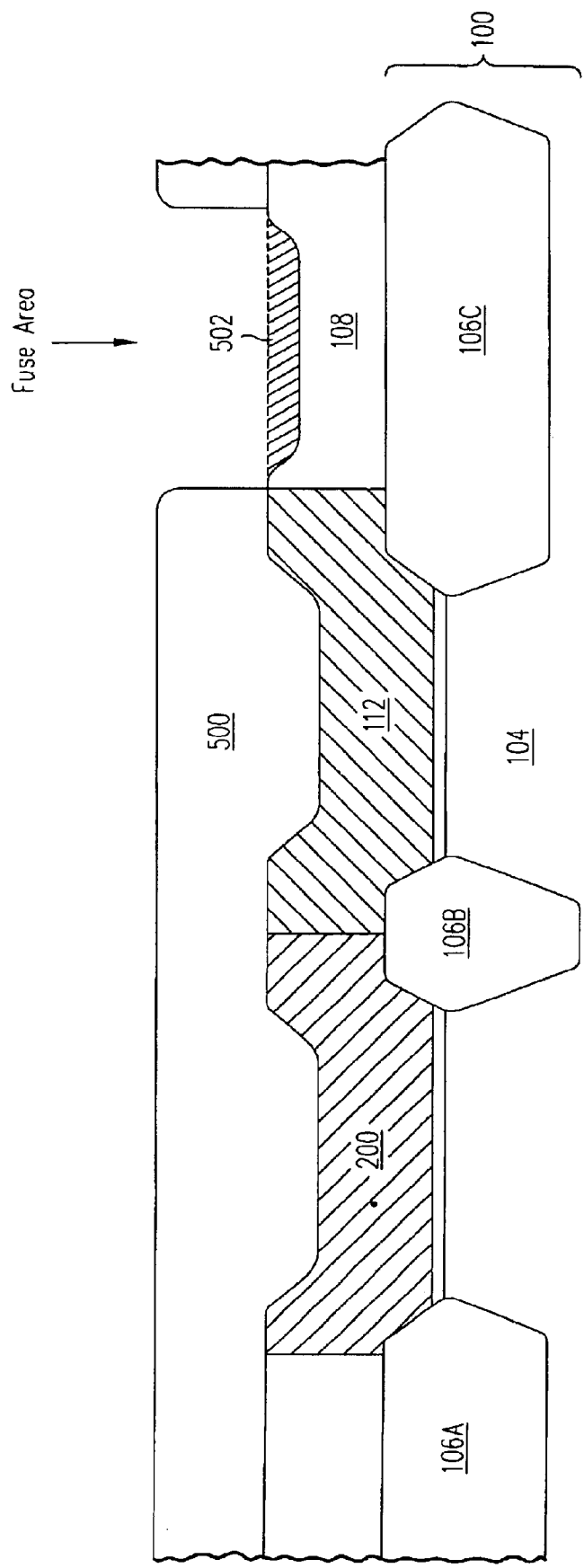
FIG. 5 illustrates the structure of FIG. 1 at another stage of processing, which may be after processing in FIG. 2.
Figure 6:
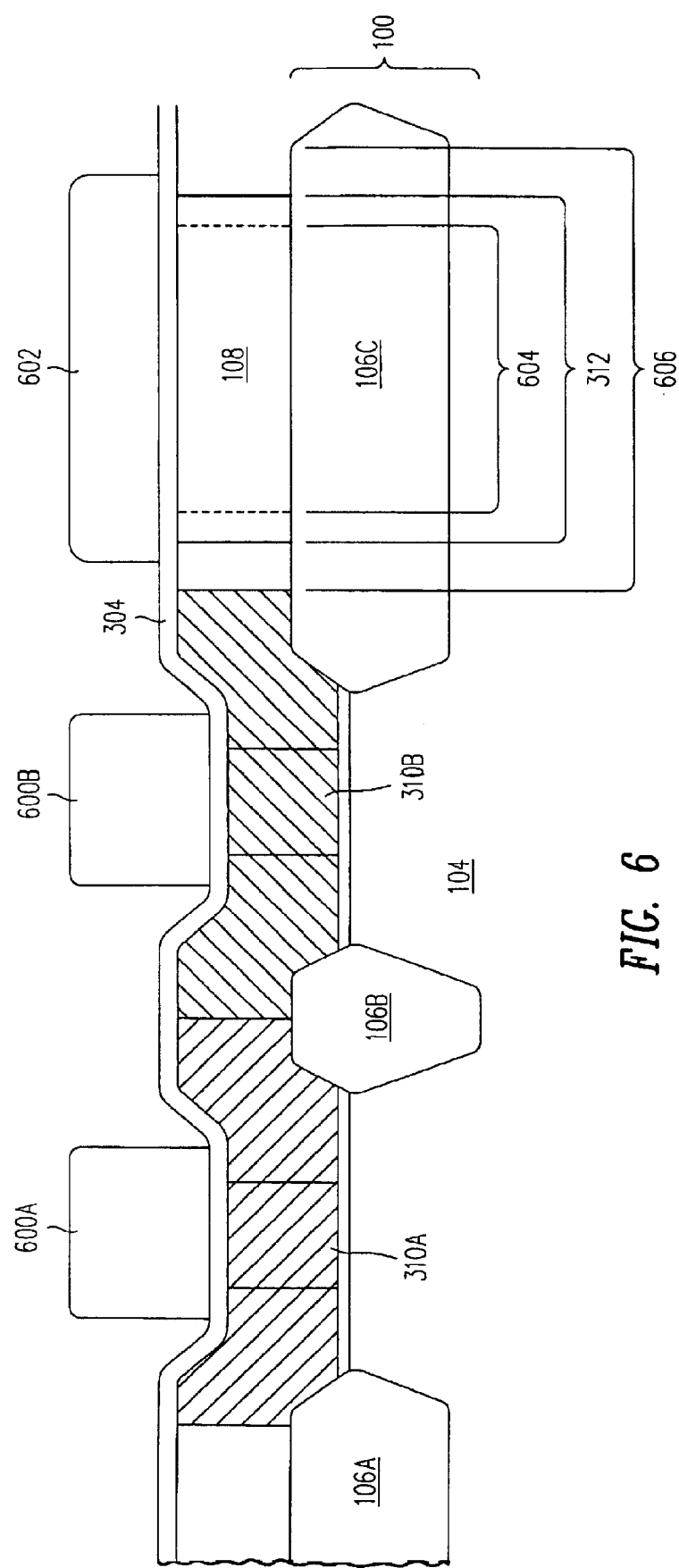
FIG. 6 illustrates the structure of FIG. 1 at another stage of processing, which may be after processing in FIG. 2.
Figure 7A:
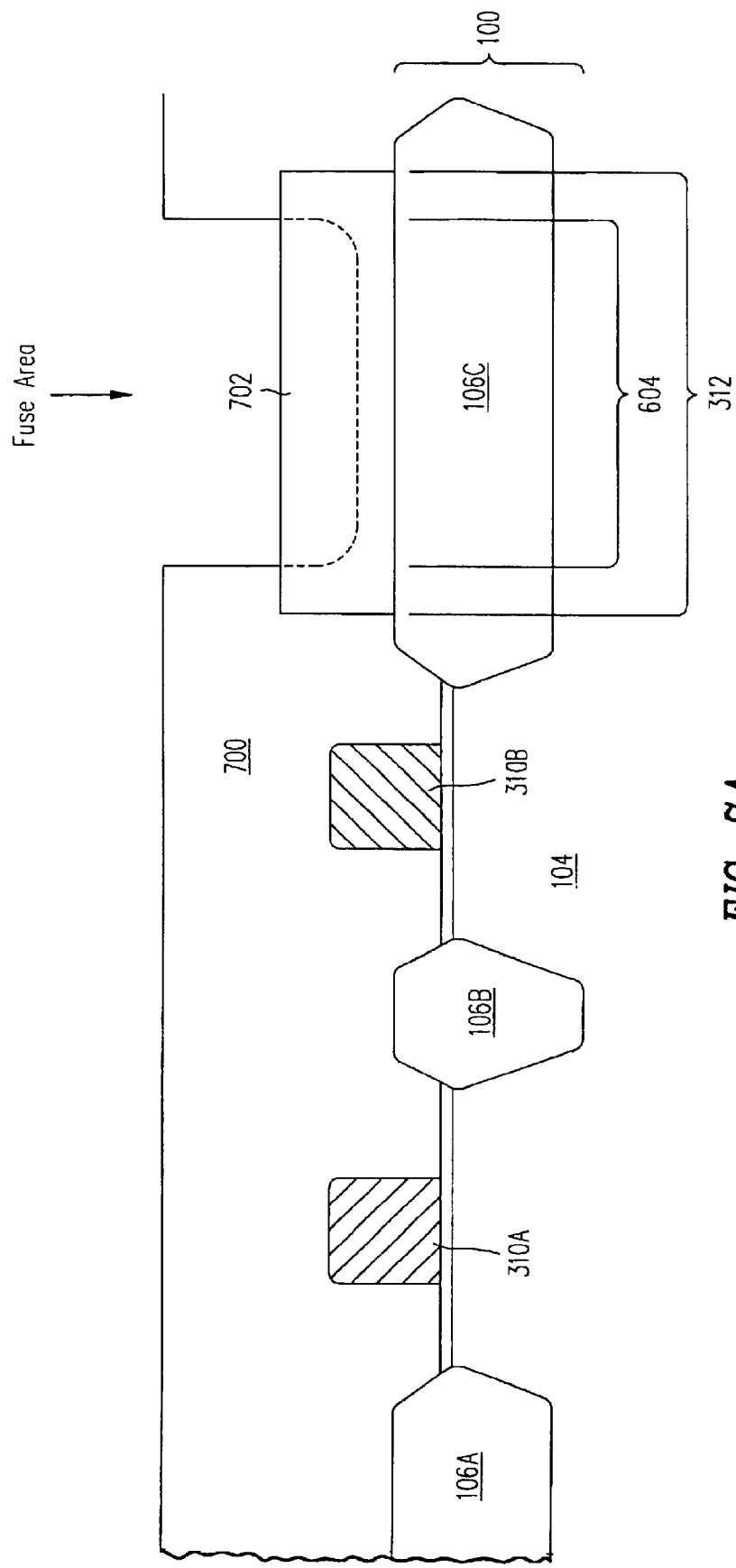
FIG. 7A illustrates the structure of FIG. 1 at another stage of processing, which may be, after processing in FIG. 6.

There are at least two methods of forming different polysilicon thicknesses for a transistor gate area and a fuse area. FIG. 5 illustrates one method, and FIGS. 6 and 7A illustrates another method.

Option One

FIG. 5 illustrates the structure 100 of FIG. 1 at another stage of processing, which may be after processing in FIG. 2. In FIG. 5, a patterned mask 500 such as a photoresist for the fuse area is defined and formed. Then a polysilicon thinning etch process may be applied to the polysilicon layer 108 to form an etched fuse area 502. Then the processes described above with reference to FIGS. 3–4, such as resist trimming, BARC etching and polysilicon etching (main etch, soft landing, over-etch), may be modified to provide multiple polysilicon thicknesses for transistor and fuse areas.

Option Two

If it is difficult to modify polysilicon etching (main etch, soft landing, over-etch) described above with reference to FIGS. 3–4 to form multiple polysilicon thicknesses for transistor and fuse areas, then another method may be performed instead of the method described above with reference to FIG. 5.

FIG. 6 illustrates the structure 100 of FIG. 1 at another stage of processing, which may be after processing in FIG. 2. In FIG. 6, a BARC layer 304 is deposited, as in FIG. 3. Then a photoresist layer is formed and trimmed to form masks 600A, 600B, 602 that are wider than the structures 306A, 306B, 308 in FIG. 3. Instead of defining patterns to etch the transistor and fuse polysilicon areas 310A, 310B, 312 (as in FIGS. 3 and 4), the structures 600A, 600B, 602 in FIG. 6 protect the future polysilicon transistor gate and fuse areas 310A, 310B, 312 for later etching.

FIG. 7A illustrates the structure 100 of FIG. 1 at another stage of processing, which may be after processing in FIG. 6. In FIG. 7A, a first etch process may form polysilicon transistor gate structures 310A, 310B and delineate an approximate polysilicon fuse structure 312 in FIG. 7A. The approximate polysilicon fuse structure 312 is over-sized to provide some extra material to process an actual polysilicon fuse area 604, as shown in FIGS. 6 and 7A.

There are two criteria for determining the width of the fuse mask 602 in FIG. 6. First, the fuse mask 602 should be sufficiently wide to enclose the actual "fusing" portion 604 of the fuse. In other words, the fuse mask 602 should be wider than the electrically active portion of the fuse. Second, the fuse mask 602 should be enclosed by the poly fuse area 606 such that a poly etch process does not attack active Si. In other words, the fuse mask 602 should be narrower than the outer edges of the poly fuse area 606.

A fuse definition mask 700 in FIG. 7A may then be formed to protect the polysilicon transistor gate areas 310A, 310B. Then a thinning etch process is applied to the approximate polysilicon fuse structure 312 to remove some polysilicon material 702 and form the actual polysilicon fuse area 604. In order to facilitate a consistent manufacturable process, this thinning etch may employ interferometric end-point (IEP) techniques to terminate the etch when a specified thickness of polysilicon remains unetched. IEP is a technique available in most state-of-the-art commercial etch tools, e.g. from LAM or AMAT. Thus, separate polysilicon etches are performed for gate and fuse areas.

Thereafter, conventional CMOS processes may be applied, such as implanting, forming spacers 402A–402F (FIG. 4), more implants, cobalt deposition, CoSi formation anneal and stripping any unreacted cobalt that did not react to form CoSi.

FIG. 7B illustrates the structure of FIG. 1 at another stage of processing, which may be after processing in FIG. 5 or FIGS. 6 and 7A. FIG. 7B shows a fresh or unprogrammed fuse area that directly contacts the insulator 106C.

FIG. 7C illustrates the structure of FIG. 1 at another stage of processing, which may be after processing in FIG. 5 or FIGS. 6 and 7A. FIG. 7B shows a fresh or unprogrammed fuse area that is separated from the insulator 106C by an acceptably thin layer of polysilicon 750.

Advantages of the Improved Fuse After Programming

After the unreacted cobalt 404 in FIG. 4 is removed, the cobalt, titanium or nickel polysilicide (or silicided polysilicon) fuse layer 410 has a low resistance as current may pass from one end of the fuse layer 410 to the other end. The fuse may be called a fresh or pre-programmed fuse. The fuse may be later programmed by agglomeration, as understood by those of ordinary skill in the integrated circuit processing art. In one embodiment, the agglomeration occurs at about 1000 degrees Celsius.

Figure 8:
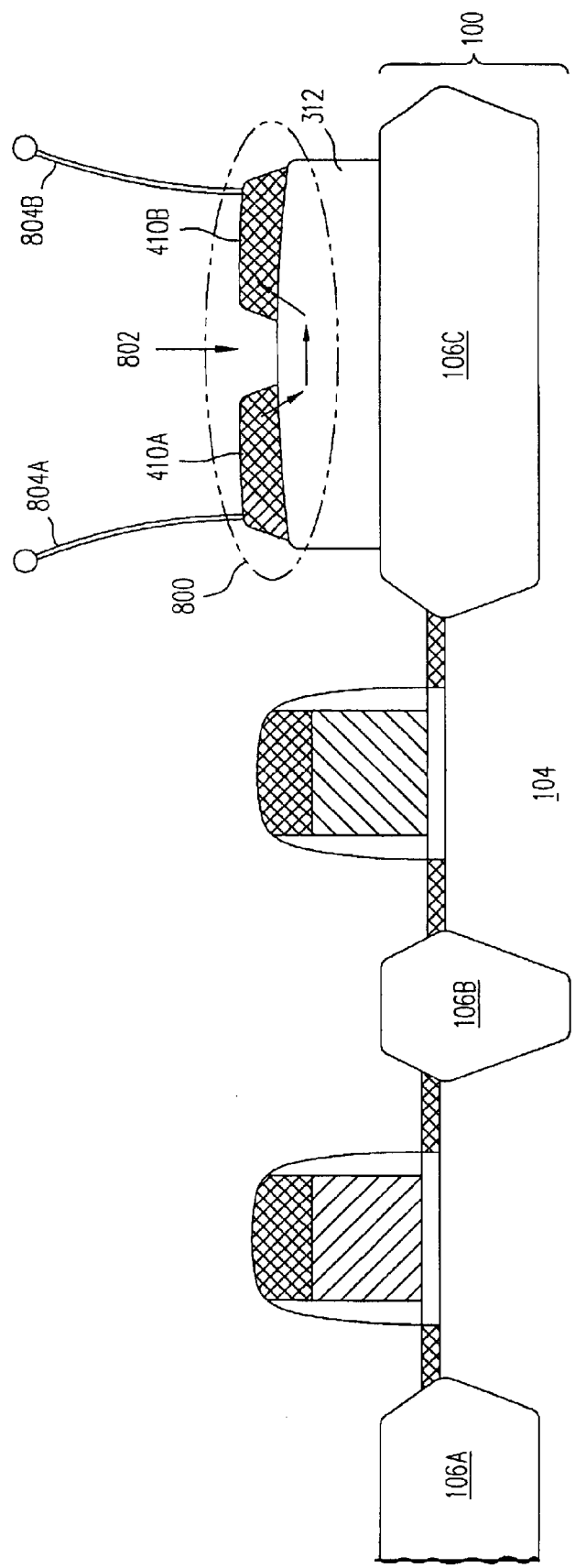
FIG. 8 illustrates a programmed fuse on the structure of FIG. 1 at another stage of processing, which may be after processing in FIG. 4.

FIG. 8 illustrates a programmed fuse 800 on the structure 100 of FIG. 1 at another stage of processing, which may be after processing in FIG. 4. The programmed fuse 800 in FIG. 8 has two polysilicide areas 410A, 410B on the polysilicon layer 312. The two polysilicide areas 410A, 410B are coupled to traces or conductors 804A, 804B. The two polysilicide areas 410A, 410B are separated by an agglomerated region 802, which exposes a part of the underlying polysilicon layer 312.

The programmed fuse 800 in FIG. 8 has a post-programming resistance that is higher than a pre-programming resistance because of the agglomerated region 802. But some current still flows through the polysilicon layer 312, as shown by the arrows in FIG. 8.

Figure 9A:
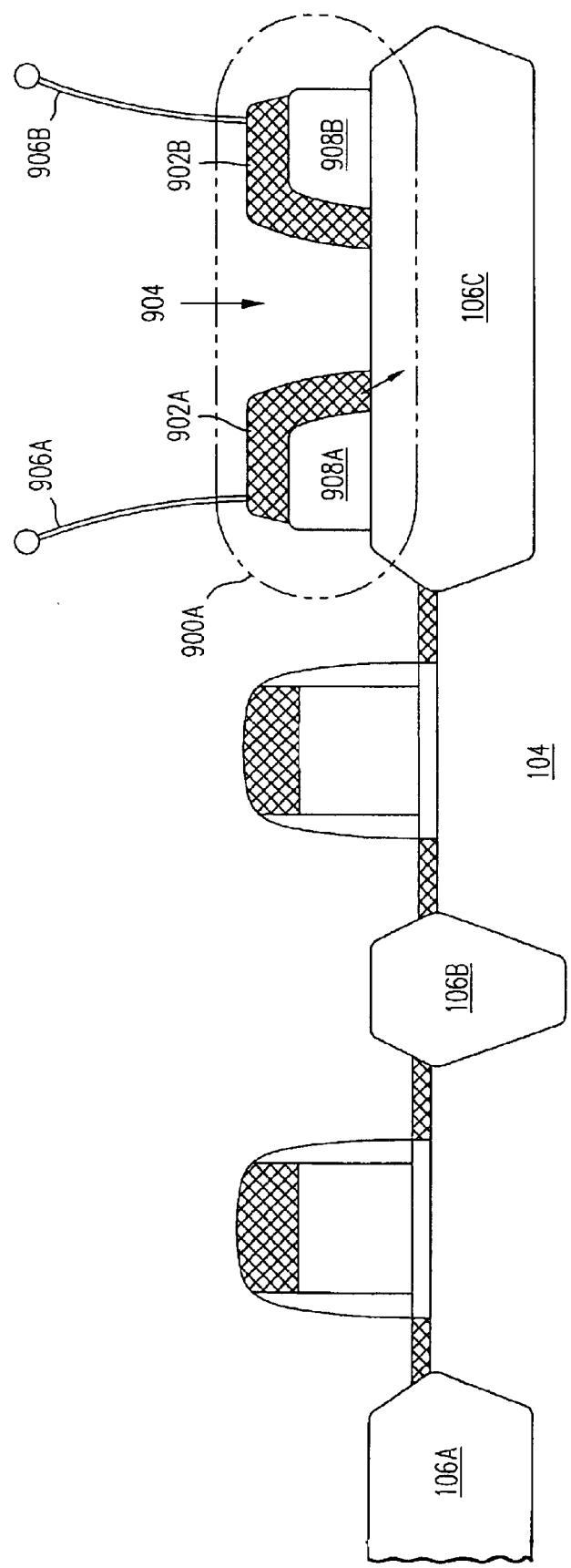
FIG. 9A illustrates a programmed fuse on the structure of FIG. 1 at another stage of processing, which may be after cobalt deposition, CoSi formation anneal and stripping unreacted cobalt after processing in FIG. 5 or FIGS. 6 and 7A.

FIG. 9A illustrates a programmed fuse 900A on the structure 100 of FIG. 1 at another stage of processing, which may be after cobalt deposition, CoSi formation anneal and stripping unreacted cobalt after processing in FIG. 5 or FIGS. 6 and 7A. In FIGS. 5 and 7A, the polysilicon fuse layer is thinner than in FIG. 4 such that substantially all of the polysilicon in the fuse area in FIGS. 5 and 7A is consumed during silicidation (see FIG. 7B).

Figure 9B:
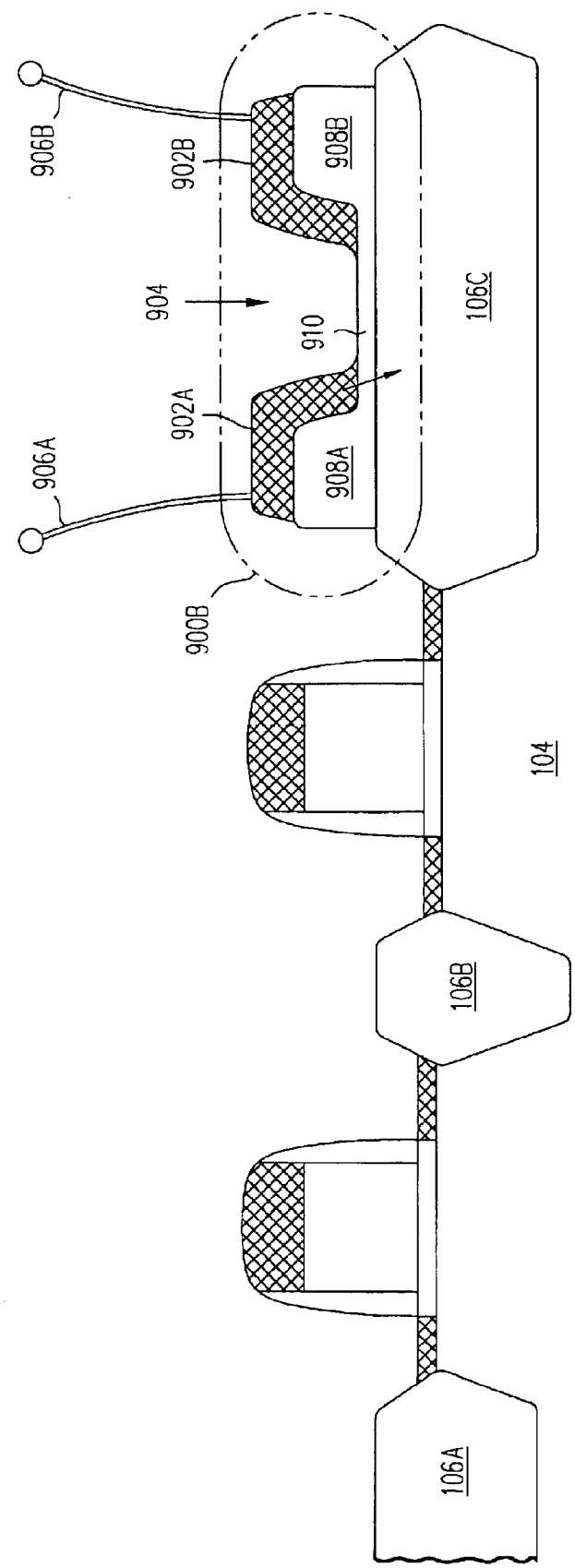
FIG. 9B illustrates another programmed fuse on the structure of FIG. 1 at another stage of processing, which may be after cobalt deposition, CoSi formation anneal and stripping unreacted cobalt after processing in FIG. 5 or FIGS. 6 and 7A.

FIG. 9B illustrates another programmed fuse 900B on the structure 100 of FIG. 1 at another stage of processing, which may be after cobalt deposition, CoSi formation anneal and stripping unreacted cobalt after processing in FIG. 5 or FIGS. 6 and 7A. In FIG. 9B, an acceptable amount 910 of polysilicon is not consumed during silicidation (see FIG. 7C), possibly to accommodate other CMOS process conditions.

After programming (agglomeration), the programmed fuses 900A, 900B in FIGS. 9A and 9B have two polysilicide areas 902A, 902B. The two polysilicide areas 902A, 902B in FIG. 9A contact the surface of the insulator 106C. The two polysilicide areas 902A, 902B in FIG. 9B contact the acceptable amount 910 of polysilicon.

The two polysilicide areas 902A, 902B in FIGS. 9A and 9B are coupled to plugs or conductors 906A, 906B. The two polysilicide areas 902A, 902B are separated by an agglomerated region 904, which exposes a part of the insulator layer 106C in FIG. 9A and exposes a part of the polysilicon 910 in FIG. 9B.

The programmed fuses 900A, 90013 in FIGS. 9A, 9B have a post-programming resistance that is much higher than a pre-programming resistance (high figure of merit) because the agglomerated region 904 exposes the insulator 106C in FIG. 9A or a thin layer of polysilicon 910 in FIG. 9B. There is no current flowing through the insulator 106C, as shown by the single arrow in FIG. 9A. Thus, the programmed fuse 900A in FIG. 9A forms an ideal open circuit (i.e., broken circuit). Similarly, there is a negligible amount of current flowing through the insulator 106C and thin polysilicon layer 910 in FIG. 9B.

Figure 10:
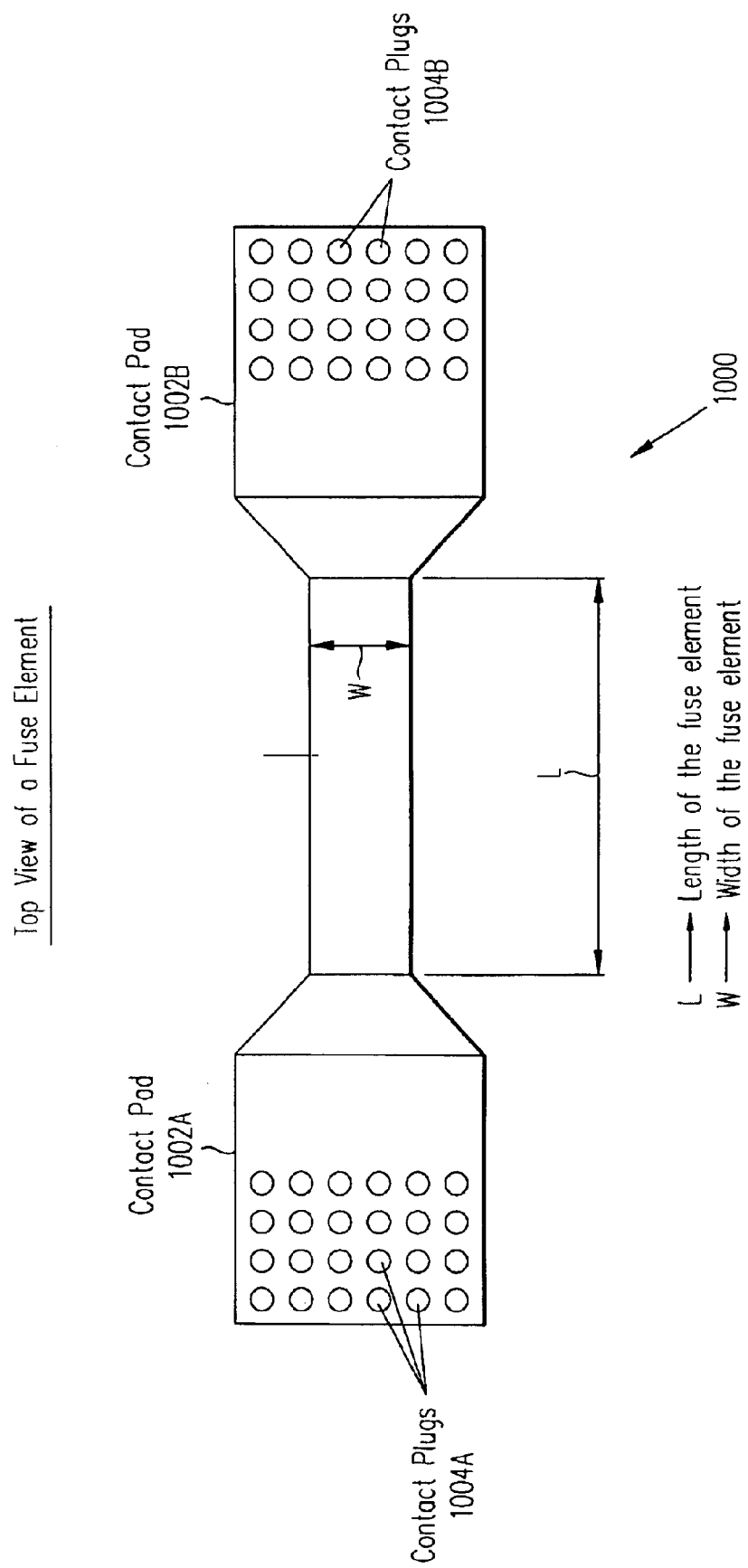
FIG. 10 is a top view of an unprogrammed fuse at another stage of processing, which may be after cobalt deposition, CoSi formation anneal and stripping un-reacted cobalt after processing in FIG. 5 or FIGS. 6 and 7A.

FIG. 10 is a top view of an unprogrammed fuse 1000 at another stage of processing, which may be after cobalt deposition, CoSi formation anneal and stripping unreacted cobalt after processing in FIG. 5 or FIGS. 6 and 7A. The fuse length L, width W and shape of the fuse element 1000 are optimized for programming at lower voltages. The contact plugs 1004A, 1004B on the contact pads 1002A, 1002B are used to electrically connect the fuse element 1000 to a power supply voltage, which may be used to program the fuse 1000.

The above-described embodiments of the present invention are merely meant to be illustrative and not limiting. Various changes and modifications may be made without departing from the invention in its broader aspects. The appended claims encompass such changes and modifications within the spirit and scope of the invention.

What is claimed is:

1. A method of forming a polysilicide fuse, the method comprising:

forming a polysilicon layer overlying a surface of a silicon substrate, the silicon substrate having a first insulator formed on the surface of the silicon substrate;

forming a mask layer over the polysilicon layer, the mask layer exposing an area of the polysilicon layer over the first insulator;

etching the exposed area of the polysilicon layer to form an approximate fuse structure;

forming a fuse definition mask over the approximate fuse structure, the fuse definition mask exposing an area of the approximate fuse structure;

etching the exposed area of the approximate fuse structure to form an actual fuse structure, wherein the exposed area of the approximate fuse structure is etched to a predetermined depth thereby controlling a thickness of a remaining polysilicon layer after annealing;

depositing a metal layer over the exposed area of the polysilicon; and annealing the metal layer to form polysilicide.

2. The method of claim 1, wherein a second insulator is on the substrate and is spaced apart from the first insulator and wherein the metal layer reacts to form a gate region, a source region and a drain region for a transistor between the first insulator and the second insulator during the annealing.

3. The method of claim 1, wherein the polysilicon layer after annealing is about 100 to 200 nanometers in thickness.

4. The method of claim 1, wherein the polysilicon layer after annealing is about 10 to 50 nanometers in thickness.

5. The method of claim 1, wherein the metal layer comprises cobalt.

6. The method of claim 1, wherein the metal layer comprises titanium.

7. The method of claim 1, wherein the metal layer comprises nickel.

8. The method of claim 1, wherein the metal layer is about 150 Å thick.

9. The method of claim 1, wherein the annealing comprises:
forming CoSi by annealing at a temperature of about 430–480° C. for about one minute in duration;
stripping unreacted Co; and
forming $CoSi_2$ by annealing at a temperature of about 675–775° C. for a few seconds in duration.

10. The method of claim 1, wherein a second insulator is on the substrate and is spaced apart from the first insulator, and further comprising forming a transistor on the surface of the silicon substrate between the first insulator and the second insulator.

11. The method of claim 1, wherein a second insulator is on the substrate and is spaced apart from the first insulator, further comprising:
forming a bottom anti-reflective coating (BARC) on the polysilicon layer; forming a photoresist layer on the BARC;
trimming the photoresist layer to form a first photoresist structure over the silicon substrate between the first insulator and the second insulator and a second photoresist structure over the first insulator; and
using the first and second photoresist structure to etch portions of the BARC and the polysilicon layer and thereby form a polysilicon gate area and a polysilicon fuse area.

12. A method of forming an integrated circuit with a transistor and a polysilicide fuse, the method comprising:
forming a polysilicon layer on a surface of a silicon substrate, the silicon substrate having a first insulator and a second insulator formed at two areas on the surface of the silicon substrate;
forming a bottom anti-reflective coating (BARC) on the polysilicon layer;
forming a photoresist layer on the BARC and trimming the photoresist layer to form a first photoresist structure and a second photoresist structure, the first photoresist structure over a first area of the BARC, a first area of the polysilicon and a first area between the first insulator and the second insulator, the second photoresist structure over a second area of the BARC, a second area of the polysilicon and an area of the second insulator, the second photoresist structure wider than a predetermined width of a fuse element;
removing the BARC and etching portions of the polysilicon layer to form a polysilicon transistor gate structure and a polysilicon fuse structure, the polysilicon fuse structure being wider than the predetermined width of the fuse element;
forming a mask layer over the polysilicon transistor gate structure, the mask layer exposing an area of the polysilicon fuse structure;
etching the exposed area of the polysilicon layer to form an approximate fuse structure;
forming a fuse definition mask over the approximate fuse structure, the fuse definition mask exposing an area of the approximate fuse structure;
etching the exposed area of the approximate fuse structure to form an actual fuse structure, wherein the exposed area of the approximate fuse structure is etched to a pre-determined depth thereby controlling a thickness of a remaining polysilicon layer after annealing;
depositing a metal layer over the exposed area of the polysilicon; annealing the metal layer to form a polysilicide fuse; and
forming a drain region and a source region, thereby forming the transistor.

13. A method of forming a polysilicide fuse, the method comprising: providing a silicon substrate;
providing an insulator overlying the silicon substrate;
forming a polysilicon layer on a surface of the silicon substrate directly over the insulator;
forming a mask layer over the polysilicon layer, the mask layer exposing a partial area of the polysilicon layer over the insulator;
etching the exposed area of the polysilicon layer to form an approximate fuse structure;
forming a fuse definition mask over the approximate fuse structure, the fuse definition mask exposing an area of the approximate fuse structure;
etching the exposed area of the approximate fuse structure to form an actual fuse structure, wherein the exposed area of the approximate fuse structure is etched to a predetermined depth thereby controlling a thickness of a remaining polysilicon layer after annealing;
depositing a metal layer over the etched exposed area of the polysilicon; and
annealing the metal layer to form polysilicide.

14. The method of claim 13, wherein annealing the metal layer leaves a polysilicon layer about 100 to 200 nanometers in thickness.

15. The method of claim 13, wherein annealing the metal layer leaves a polysilicon layer about 10 to 50 nanometers in thickness.

16. The method of claim 13, wherein the metal layer comprises cobalt.

17. The method of claim 13, wherein the metal layer comprises titanium.

18. The method of claim 13, wherein the metal layer comprises nickel.

19. The method of claim 13, wherein the deposited metal layer is about 150 Å in thickness.

20. A method of forming a transistor and a polysilicide fuse, the method comprising:
providing a silicon substrate;
providing a first insulator overlying the silicon substrate;
providing a second insulator spaced apart from the first insulator, the second insulator overlying the silicon substrate;
forming a polysilicon layer on a surface of the silicon substrate wherein a first region of the polysilicon layer is directly over the first insulator, and a second region of the polysilicon layer is on a surface of the silicon substrate between the first insulator and the second insulator to form a gate area;
forming a mask layer over the polysilicon layer, the mask layer exposing a first area over the first region of the polysilicon layer and exposing a second area over the second region of the polysilicon layer;
etching the exposed first area of the polysilicon layer to form an approximate fuse structure;
forming a fuse definition mask over the fuse structure, the fuse definition mask exposing an area of the approximate fuse structure;
etching the exposed first area of the approximate fuse structure to form an actual fuse structure, wherein the exposed area of the approximate fuse structure is etched above the first insulator to a predetermined depth thereby controlling a thickness of a remaining polysilicon layer after annealing;

depositing a metal layer over the etched exposed first area and the exposed second area of the polysilicon;

annealing the metal layer to form polysilicide; and forming a drain and source area of the transistor in the silicon substrate.

21. The method of claim 20, wherein annealing the metal layer leaves a polysilicon layer about 100 to 200 nanometers in thickness.

22. The method of claim 20, wherein annealing the metal layer leaves a polysilicon layer about 10 to 50 nanometers in thickness.

23. The method of claim 20, wherein the metal layer comprises cobalt.

24. The method of claim 20, wherein the metal layer comprises titanium.

25. The method of claim 20, wherein the metal layer comprises nickel.

26. The method of claim 20, wherein the deposited metal layer is about 150 Å in thickness.

* * * * *